United States Patent
Chen et al.

(10) Patent No.: US 8,514,108 B2
(45) Date of Patent: Aug. 20, 2013

(54) SINGLE STAGE AND SCALABLE SERIALIZER

(75) Inventors: Hua-Feng Chen, Queen Creek, AZ (US); Karthik Chandrasekharan, Chandler, AZ (US); Ramamurthy Gorti, Peoria, AZ (US); Gregory Djaja, Phoenix, AZ (US); Douglas Smith, Mesa, AZ (US)

(73) Assignee: Broadcom Corporation, Irvine, CA (US)

( * ) Notice: Subject to any disclaimer, the term of this patent is extended or adjusted under 35 U.S.C. 154(b) by 104 days.

(21) Appl. No.: 13/115,411

(22) Filed: May 25, 2011

(65) Prior Publication Data
US 2012/0299756 A1  Nov. 29, 2012

(51) Int. Cl.
*H03M 9/00* (2006.01)
(52) U.S. Cl.
USPC .......................................... 341/101; 341/100
(58) Field of Classification Search
USPC .................................... 341/100, 101
See application file for complete search history.

(56) References Cited

U.S. PATENT DOCUMENTS

| | | | | |
|---|---|---|---|---|
| 5,172,397 A * | 12/1992 | Llewellyn | ...................... | 375/359 |
| 5,270,714 A * | 12/1993 | Tanaka et al. | .................... | 341/59 |
| 5,982,309 A * | 11/1999 | Xi et al. | ........................ | 341/101 |
| 6,480,512 B1 * | 11/2002 | Ahn | .................................. | 370/545 |
| 6,801,144 B2 * | 10/2004 | Matsudera et al. | ........... | 341/100 |
| 7,307,558 B1 * | 12/2007 | Karim et al. | .................. | 341/100 |
| 7,876,245 B2 * | 1/2011 | Lee | ................................ | 341/101 |
| 2006/0103557 A1 * | 5/2006 | Padaparambil | ............... | 341/101 |
| 2012/0200436 A1 * | 8/2012 | Wang | ............................ | 341/100 |

* cited by examiner

*Primary Examiner* — Linh Nguyen
(74) *Attorney, Agent, or Firm* — Farjami & Farjami LLP

(57) ABSTRACT

According to an exemplary embodiment, a serializer includes upper and lower shift registers configured to perform a load function where parallel input data is loaded from a parallel input bus and a shift function where the parallel input data is shifted to an output register. The upper shift register is configured to perform the load function while the lower shift register performs the shift function, and the lower shift register is configured to perform the load function while the upper shift register performs the shift function. An output register is configured to alternately receive the parallel input data from the upper shift register and the parallel input data from the lower shift register. The upper and lower shift registers and the output register can comprise scan flip-flops.

20 Claims, 4 Drawing Sheets

SINGLE STAGE AND SCALABLE SERIALIZER

BACKGROUND OF THE INVENTION

1. Field of the Invention

The present invention is generally in the field of electrical circuits and systems. More particularly, the invention relates to electrical circuits and systems utilized in conversion of parallel data into serial data.

2. Background Art

A serializer can be used to convert low-speed data on a parallel input bus into high-speed data on a serial output. The parallel input bus includes multiple channels, which are sequentially selected by the serializer so as to transfer the data from the parallel input bus to the serial output. Conventional serializers typically include various features, which result in a slow conversion speed, high power consumption, and/or large size. Furthermore, many conventional serializer designs are not scalable and require substantial redesign when the number of channels of the parallel input bus is varied.

Conventional serializers typically convert the low-speed data into the high-speed data in multiple stages. For example, the parallel input bus can have sixteen channels where the low-speed data is converted by one stage into mid-speed data on four channels, which is then converted into the high-speed data on the serial output. However, designing a serializer with multiple stages can be result in a larger, slower, and/or more complicated design. Furthermore, these designs are typically not scalable, consume high power, and/or can be undesirably large. Conventional serializers may also place synchronization or re-time flip-flops and multiplexers or other combinational logic in a data conversion path of the serializer, thereby reducing conversion speed and increasing the size of the serializer. Some serializers may require a phase shifter to generate a signal for controlling selection of the channels in the serializer. However, the phase shifter can be difficult to design and is typically not scalable. Also, some serializers may utilize current mode logic (CML) for the conversion. While CML may be fast, additional circuitry may be required to convert from a complementary metal oxide semiconductor (CMOS) signal to a CML signal, thereby increasing the size of the serializer. Furthermore, CML requires a constant bias current resulting in high power consumption.

Thus, there is a need in the art for a serializer that can have high conversion speed, low power consumption, and small size while being scalable to accommodate variation in the number of channels of the parallel input.

SUMMARY OF THE INVENTION

A single stage and scalable serializer, substantially as shown in and/or described in connection with at least one of the figures, and as set forth more completely in the claims.

DETAILED DESCRIPTION OF THE INVENTION

The present invention is directed to a single stage and scalable serializer. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention that use the principles of the present invention are not specifically described in the present application and are not specifically illustrated by the present drawings.

Figure 1:
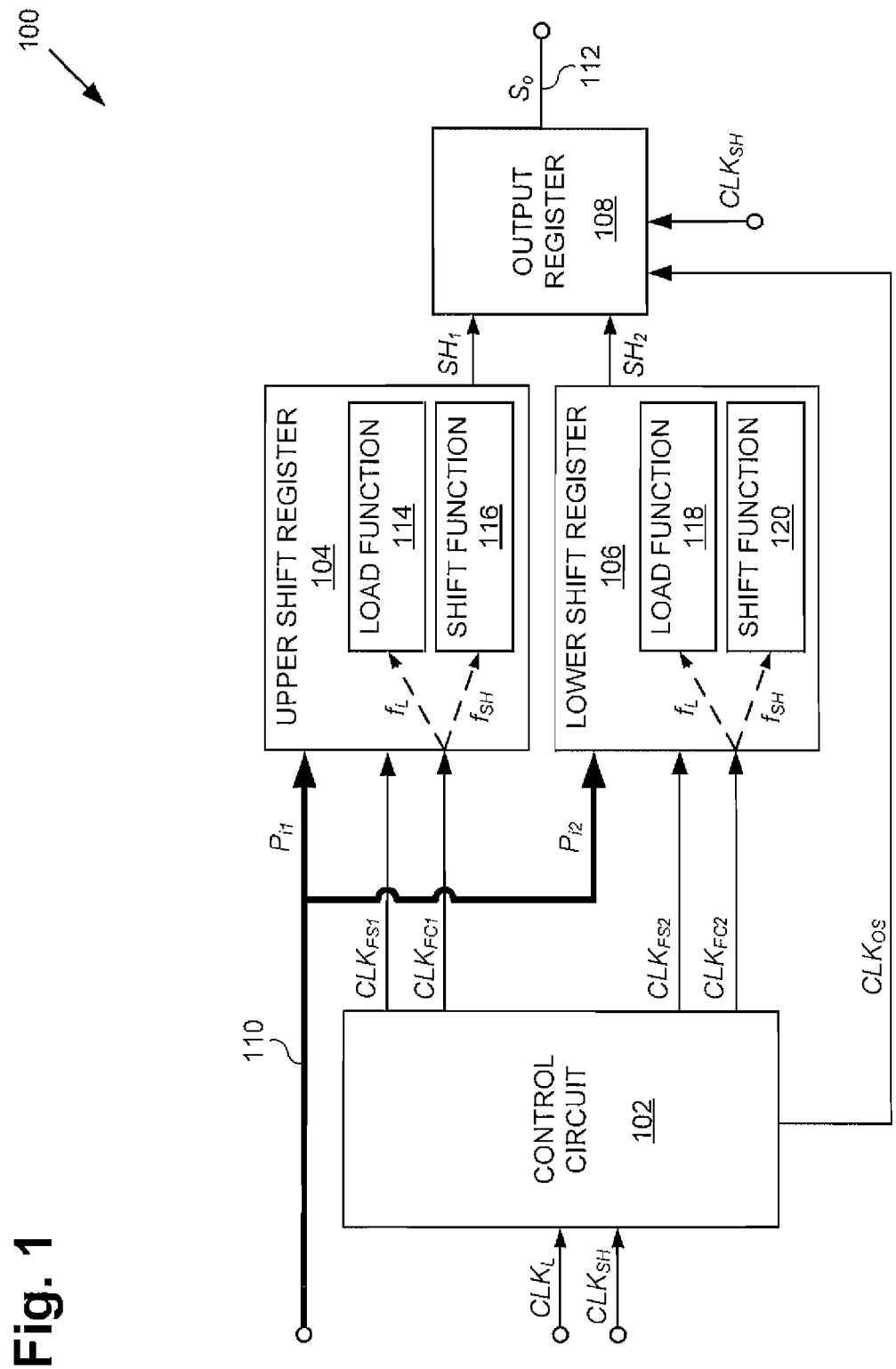
FIG. 1 illustrates an exemplary serializer, according to one embodiment of the invention.

FIG. 1 illustrates serializer 100, according to one embodiment of the invention. Serializer 100 includes control circuit 102, upper shift register 104, lower shift register 106, output register 108, parallel input bus 110, and serial output 112.

In FIG. 1, parallel input bus 110 comprises a plurality of channels and serializer 100 is configured to convert data from the plurality of channels into serial output 112. For example, in FIG. 1, serializer 100 is configured to convert parallel input data $P_{i1}$ and $P_{i2}$ into serial output data $S_o$. As an example, parallel input bus 110 can have eight channels and serializer 100 can convert the eight channels into serial output 112 comprising a single channel. Parallel input data $P_{i1}$ and $P_{i2}$ each comprise one bit per channel of parallel input bus 110. Thus, in the above example, parallel input data $P_{i1}$ and $P_{i2}$ each comprise eight bits.

In serializer 100, upper shift register 104 is configured to perform load function 114 where parallel input data $P_{i1}$ is loaded from parallel input bus 110 and shift function 116 where parallel input data $P_{i1}$ is shifted to output register 108. As described above, parallel input data $P_{i1}$ comprises one bit per channel of parallel input bus 110 and those bits are loaded in parallel into upper shift register 104 by load function 114. Output register 108 can receive parallel input data $P_{i1}$ from upper shift register 104 as shifted (serialized) data $SH_1$, which comprises parallel input data $P_{i1}$ after being shifted through upper shift register 104 by shift function 116. Output register 108 can provide shifted (serialized) data $SH_1$ in serial output data $S_o$ at serial output 112.

Similarly, lower shift register 106 is configured to perform load function 118 where parallel input data $P_{i2}$ is loaded from parallel input bus 110 and shift function 120 where parallel input data $P_{i2}$ is shifted to output register 108. As described above, parallel input data $P_{i2}$ comprises one bit per channel of parallel input bus 110 and those bits are loaded in parallel into lower shift register 106 by load function 118. Output register 108 can receive parallel input data $P_{i2}$ from lower shift register 106 as shifted (serialized) data $SH_2$, which comprises parallel input data $P_{i2}$ after being shifted through lower shift register 106 by shift function 120. Output register 108 can provide shifted (serialized) data $SH_2$ in serial output data $S_o$ at serial output 112.

In serializer 100, output register 108 is configured to alternately receive parallel input data $P_{i1}$ from upper shift register 104 as shifted (serialized) data $SH_1$ and parallel input data $P_{i2}$ from lower shift register 106 as shifted (serialized) data $SH_2$ to provide serial output data $S_o$ at serial output 112. In the present embodiment, output register 108 is configured to alternate between receiving parallel input data $P_{i1}$ from upper shift register 104 as shifted (serialized) data $SH_1$ and parallel input data $P_{i2}$ from lower shift register 106 as shifted (serialized) data $SH_1$. Thus, serial output data $S_o$ at serial output 112 comprises a stream of serialized data alternating between parallel input data $P_{i1}$ and parallel input data $P_{i2}$.

As shown in FIG. 1, serializer 100 receives load clock $CLK_L$ and shift clock $CLK_{SH}$ as inputs to convert parallel input data $P_{i1}$ and $P_{i2}$ into serial output data $S_o$. Control circuit 102 receives load clock $CLK_L$ and shift clock $CLK_{SH}$ to manage upper shift register 104 and lower shift register 106 to convert parallel input data $P_{i1}$ and parallel input data $P_{i2}$ into serial output data $S_o$. For example, control circuit 102 utilizes load clock $CLK_L$ to set frequency $f_L$ of load functions 114 and 118. More particularly, load functions 114 and 118 are performed by upper and lower shift registers 104 and 106 respectively at frequency $f_L$, which in the present embodiment is the same frequency as load clock $CLK_L$. In the present embodiment, load clock $CLK_L$ is a 1 GHz clock. Also, control circuit 102 utilizes shift clock $CLK_{SH}$ to set frequency $f_{SH}$ of shift functions 116 and 120. More particularly, shift functions 116 and 120 are performed by upper and lower shift registers 104 and 106 respectively at frequency $f_{SH}$, which in the present embodiment is the same frequency as shift clock $CLK_{SH}$. In the present embodiment, shift clock $CLK_{SH}$ is an 8 GHz clock.

Control circuit 102 provides function select clock $CLK_{FS1}$ and function control clock $CLK_{FC1}$ to upper shift register 104 to manage upper shift register 104 and provides function select clock $CLK_{FS2}$ and function control clock $CLK_{FC2}$ to lower shift register 106 to manage lower shift register 106 so as to convert parallel input data $P_{i1}$ and parallel input data $P_{i2}$ into serial output data $S_o$.

Upper shift register 104 is configured to select between performing load function 114 and shift function 116 responsive to function select clock $CLK_{FS1}$. For example, in the present embodiment, when function select clock $CLK_{FS1}$ is low, upper shift register 104 is configured to perform load function 114 and when function select clock $CLK_{FS1}$ is high, upper shift register 104 is configured to perform shift function 116. Thus, in the present embodiment, upper shift register 104 is configured to repeatedly perform load function 114 and shift function 116 at a frequency of function select clock $CLK_{FS1}$. In the present embodiment, function select clock $CLK_{FS1}$ has half the frequency of load clock $CLK_L$ and is a 500 MHz clock signal.

Similarly, lower shift register 106 is configured to select between performing load function 118 and shift function 120 responsive to function select clock $CLK_{FS2}$. For example, in the present embodiment, when function select clock $CLK_{FS2}$ is low, lower shift register 106 is configured to perform load function 118 and when function select clock $CLK_{FS2}$ is high, lower shift register 106 is configured to perform shift function 120. Thus, in the present embodiment, lower shift register 106 is configured to repeatedly perform load function 118 and shift function 120 at a frequency of function select clock $CLK_{FS2}$. In the present embodiment, function select clock $CLK_{FS2}$ has half the frequency of load clock $CLK_L$ and is a 500 MHz clock signal.

Function select clock $CLK_{FS2}$ is the inverse of function select clock $CLK_{FS1}$. Thus, while upper shift register 104 is performing load function 114 on parallel input data $P_{i1}$, lower shift register 106 is performing shift function 120 on parallel input data $P_{i2}$. Similarly, while upper shift register 104 is performing shift function 116 on parallel input data $P_{i1}$, lower shift register 106 is performing load function 118 on parallel input data $P_{i2}$. As such, upper shift register 104 is configured to perform load function 114 while lower shift register 106 performs shift function 120 and lower shift register 106 is configured to perform load function 118 while upper shift register 104 performs shift function 116.

As shown in FIG. 1, in the present embodiment, upper shift register 104 is configured to perform load and shift functions 114 and 116 at respective frequencies based on function control clock $CLK_{FC1}$. More particularly, upper shift register 104 is configured to perform load function 114 at frequency $f_L$ of function control clock $CLK_{FC1}$ and to perform shift function 116 at frequency $f_{SH}$ of function control clock $CLK_{FC1}$. In the present embodiment, function control clock $CLK_{FC1}$ alternates between having frequency $f_L$ and frequency $f_{SH}$ at the frequency of function select clock $CLK_{FS1}$ and thus, will repeat this pattern at half the frequency of frequency $f_L$, which is the same as the frequency of load clock $CLK_L$ (e.g. every 500 MHz function control clock $CLK_{FC1}$ will repeat having frequency $f_L$ followed by having frequency $f_{SH}$).

Similarly, lower shift register 106 is configured to perform load and shift functions 118 and 120 at respective frequencies based on function control clock $CLK_{FC2}$. More particularly, lower shift register 106 is configured to perform load function 118 at frequency $f_L$ of function control clock $CLK_{FC2}$ and to perform shift function 120 at frequency $f_{SH}$ of function control clock $CLK_{FC2}$. In the present embodiment, function control clock $CLK_{FC2}$ alternates between having frequency $f_L$ and frequency $f_{SH}$ at the frequency of function select clock $CLK_{FS2}$ and thus, will repeat this pattern at half the frequency of frequency $f_L$, which is the same as the frequency of load clock $CLK_L$ (e.g. every 500 MHz function control clock $CLK_{FC2}$ will repeat having frequency $f_{SH}$ followed by having frequency $f_L$).

Also in FIG. 1, control circuit 102 is configured to provide output select clock $CLK_{OS}$ to output register 108 so as to manage output register 108. Output register 108 is configured to alternately receive parallel input data $P_{i1}$ from upper shift register 104 as shifted (serialized) data $SH_1$ and parallel input data $P_{i2}$ from lower shift register 106 as shifted (serialized) data $SH_2$ on output select clock $CLK_{OS}$. In the present embodiment, when output select clock $CLK_{OS}$ is low, output register 108 is configured to receive parallel input data $P_{i1}$ from upper shift register 104 and when output select clock $CLK_{OS}$ is high, output register 108 is configured to receive parallel input data $P_{i2}$ from lower shift register 106. Thus, in the present embodiment, output register 108 can be configured to repeatedly alternate between receiving parallel input data $P_{i1}$ from upper shift register 104 as shifted (serialized) data $SH_2$ and parallel input data $P_{i2}$ from lower shift register 106 as shifted (serialized) data $SH_2$ at a frequency of output select clock $CLK_{OS}$.

Output register 108 is configured to receive upper shift register 104 when upper shift register 104 is performing shift function 116 and is configured to receive lower shift register 106 when lower shift register 106 is performing shift function 120. Thus, output select clock $CLK_{OS}$ can be equal to one of function select clocks $CLK_{FS1}$ and $CLK_{FS2}$. For example, in the present embodiment, output select clock $CLK_{OS}$ is equal to function select clock $CLK_{FS2}$. Thus, output register 108 is configured to select between receiving parallel input data $P_{i1}$ from upper shift register 104 and parallel input data $P_{i2}$ from lower shift register 106 responsive to one of function select clocks $CLK_{FS1}$ and $CLK_{FS2}$.

Also in the present embodiment, output register 108 receives shift clock $CLK_{SH}$. Output register 108 is configured to receive parallel input data $P_{i1}$ from upper shift register 104 as shifted (serialized) data $SH_1$ and parallel input data $P_{i2}$ from lower shift register 106 as shifted (serialized) data $SH_2$ and output serial output data $S_o$ at a frequency based on shift clock $CLK_{SH}$. More particularly, output register 108 is configured to receive parallel input data $P_{i1}$ from upper shift register 104 at a frequency of shift clock $CLK_{SH}$ and receive parallel input data $P_{i2}$ from lower shift register 106 at a frequency of shift clock $CLK_{SH}$ to output serial output data $S_o$ at a frequency of shift clock $CLK_{SH}$. In the present example, shift clock $CLK_{SH}$ has frequency $f_{SH}$. As described above, upper and lower registers 104 and 106 are configured to perform shift functions at frequency $f_{SH}$ of shift clock $CLK_{SH}$. Thus, output register 108 is configured to alternately receive parallel input data $p_{i1}$ as shifted (serialized) data $SH_1$ from upper shift register 104 and parallel input data $P_{i2}$ from lower shift register 106 as shifted (serialized) data $SH_2$ at frequency $f_{SH}$ of shift clock $CLK_{SH}$. The received parallel input data $p_{i1}$ and parallel input data $p_{i2}$ can be provided in serial output data $S_o$ at frequency $f_{SH}$ of shift clock $CLK_{SH}$. Thus, in the present embodiment, shift clock $CLK_{SH}$ can correspond to the conversion speed of serializer 100, which as one example can be 8 GHz. Serial output data $S_o$ can be provided to a digital to analog converter (DAC) at 8 GHz, which is not shown in FIG. 1.

Conventional serializers typically convert low-speed data on a parallel input bus into high-speed data on a serial output in multiple stages. For example, conventionally parallel input bus 110 may have sixteen channels converted by one stage into four channels, which are then converted into serial output 112. Advantageously, in accordance with various embodiments of the present invention, serializer 100 can convert parallel input data $P_{i1}$ and $P_{i2}$ into serial output data $S_o$ in a single stage. As such, based on the above example, parallel input data $P_{i1}$ and $P_{i2}$ can each be 16 bits (one bit per channel of parallel input bus 110), which are converted into serial output data $S_o$, which comprises a one bit data stream, in a single stage. It will be appreciated that parallel input bus 110 is not limited to 16 channels. As other specific examples, parallel input bus 110 can have 32 channels and parallel input data $P_{i1}$ and $P_{i2}$ can each be 32 bits or parallel input bus 110 can have 64 channels and parallel input data $P_{i1}$ and $P_{i2}$ can each be 64 bits.

Thus, as described above, serializer 100 does not require components needed to implement multiple stages. For example, serializer 100 does not require multiplexers or other combinational logic in the data path between parallel input bus 110 and serial output 112, which would reduce conversion speed of serializer 100 and does not require complex control circuitry to manage the multiple stages. As such, serializer 100 can be small and have low power consumption. Furthermore, serializer 100 can prevent redesign of the combinational logic and complex control circuitry, which may be required when the number of channels of parallel input bus 110 is varied. Thus, serializer 100 can be easily scalable thereby reducing design cost.

Figure 2:
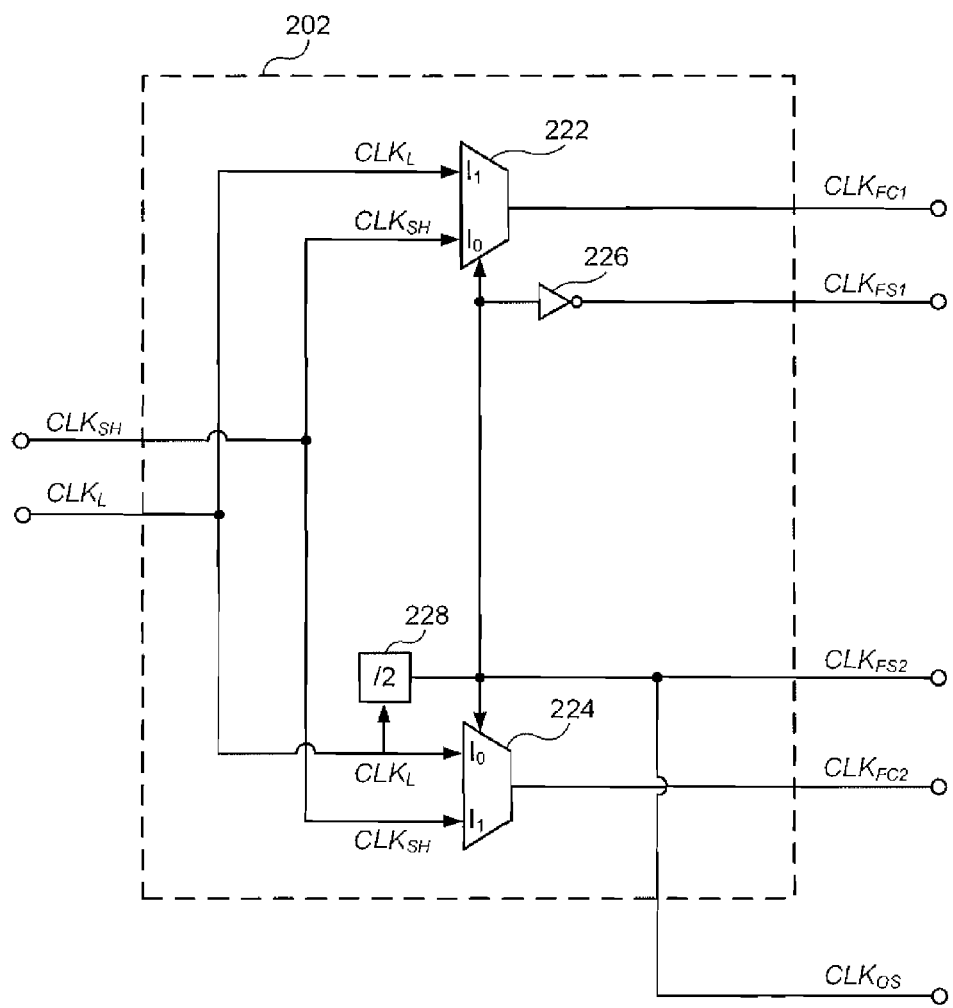
FIG. 2 illustrates an exemplary control circuit of a serializer, according to one embodiment of the invention.

FIG. 2 illustrates control circuit 202, according to one embodiment of the invention. Control circuit 202 corresponds to control circuit 102 of serializer 100 in FIG. 1. Thus, shift clock $CLK_{SH}$, load clock $CLK_L$, function select clocks $CLK_{FS1}$ and $CLK_{FS2}$, function control clocks $CLK_{FC1}$ and $CLK_{FC2}$, and output select clock $CLK_{OS}$ in FIG. 2 correspond respectively to shift clock $CLK_{SH}$, load clock $CLK_L$, function select clocks $CLK_{FS1}$ and $CLK_{FS2}$, function control clocks $CLK_{FC1}$ and $CLK_{FC2}$, and output select clock $CLK_{OS}$ in FIG. 1.

Control circuit 202 includes function controllers 222 and 224, inverter 226, and frequency divider 228. Control circuit 202 is configured to generate function select clocks $CLK_{FS1}$ and $CLK_{FS2}$, function control clocks $CLK_{FC1}$ and $CLK_{FC2}$, and output select clock $CLK_{OS}$ from shift clock $CLK_{SH}$ and load clock $CLK_L$. As described above, in the present embodiment, in FIG. 1, shift functions 116 and 120 are performed by upper and lower shift registers 104 and 106 respectively at frequency $f_{SH}$, which is the frequency of shift clock $CLK_{SH}$. Also described above, in the present embodiment, in FIG. 1, load functions 114 and 118 are performed by upper and lower shift registers 104 and 106 respectively at frequency $f_L$, which is the frequency of load clock $CLK_L$.

In the present embodiment, frequency $f_{SH}$ is equal to a frequency required to shift one bit of parallel input data $P_{i1}$ and $P_{i2}$. Also in the present embodiment, frequency $f_L$ is less than or equal to frequency $f_{SH}$ divided by the number of channels in parallel input bus 110. Thus, shift function 116, for example, can shift each and every bit of parallel input data $P_{i1}$ to output register 108 within one cycle of load clock $CLK_L$. As a specific example, in the present embodiment, frequency $f_{SH}$ is 8 GHz and frequency $f_L$ is 1 GHz. Parallel input bus 110 comprises eight channels and frequency $f_L$ has one-eighth the frequency of frequency $f_{SH}$. As such, shift function 116 can be performed to shift the eight bits of parallel input data $P_{i1}$ within one cycle of load clock $CLK_L$. In some embodiments, load clock $CLK_L$ can easily be generated from shift clock $CLK_{SH}$ using, for example, a frequency divider.

In control circuit 202, function controller 222 is configured to generate function control clock $CLK_{FC1}$ by selecting between load clock $CLK_L$ and shift clock $CLK_{SH}$. Similarly, function controller 224 is configured to generate function control clock $CLK_{FC2}$ by selecting between load clock $CLK_L$ and shift clock $CLK_{SH}$. As described above, upper shift register 104 is configured to perform load function 114 at frequency $f_L$ of function control clock $CLK_{FC1}$ and to perform shift function 116 at frequency $f_{SH}$ of function control clock $CLK_{FC1}$. Similarly, lower shift register 106 is configured to perform load function 118 at frequency $f_L$ of function control clock $CLK_{FC1}$ and to perform shift function 120 at frequency $f_{SH}$ of function control clock $CLK_{FC1}$. Thus, function controllers 222 and 224 are configured to select load clock $CLK_L$ to control load functions 114 and 118 and to select shift clock $CLK_{SH}$ to control shift functions 116 and 120. As such, upper shift register 104 is configured to perform load function 114 and shift function 116 by selectively receiving load clock $CLK_L$ and shift clock $CLK_{SH}$ and lower shift register 106 is configured to perform load function 118 and shift function 120 by selectively receiving load clock $CLK_L$ and shift clock $CLK_{SH}$.

In the present embodiment, function controllers 222 and 224 each are a multiplexer configured to select between load clock $CLK_L$ and shift clock $CLK_{SH}$. As shown in FIG. 2, function controllers 222 and 224 are configured to select between load clock $CLK_L$ and shift clock $CLK_{SH}$ based on function select clocks $CLK_{FS1}$ and $CLK_{FS2}$ respectively. As described above, function select clock $CLK_{FS2}$ is the inverse of function select clock $CLK_{FS1}$. As shown in FIG. 2, in the present embodiment, inverter 226 generates function select clock $CLK_{FS1}$ from function select clock $CLK_{FS2}$. Thus, when function controller 222 is selecting shift clock $CLK_{SH}$, function controller 224 is selecting load clock $CLK_L$ and when function controller 222 is selecting load clock $CLK_L$, function controller 224 is selecting shift clock $CLK_{SH}$.

Also in the present embodiment, upper and lower shift registers 104 and 106 in FIG. 1 is each configured to perform one respective load function 114 and 118 and one respective shift function 116 and 120 per cycle of respective function select clocks $CLK_{FS1}$ and $CLK_{FS2}$. In the example used above, upper shift register 104 can perform one load function 114 to load eight bits in parallel at 1 GHz and perform one shift function 116 to shift eight bits at 8 GHz all in one cycle of function select clock $CLK_{FS1}$. Thus, function select clocks $CLK_{FS1}$ and $CLK_{FS2}$ can advantageously be generated from load clock $CLK_L$. For example, in the present embodiment, control circuit 202 includes frequency divider 228, which is a divide-by-two frequency divider in the present example. As such, while load clock $CLK_L$ has a frequency of 1 GHz, function select clocks $CLK_{FS1}$ and $CLK_{FS2}$ have a frequency of 500 MHz. Thus, during every cycle of function select clock $CLK_{FS1}$, for example, upper shift register 104 is configured to perform one load function 114 to load eight bits at 1 GHz in parallel and to perform one shift function 116 to shift the eight bits of parallel input data $P_{i1}$ into output register 108 at 8 GHz.

FIG. 2 shows output select clock $CLK_{OS}$ as equal to function select clock $CLK_{FS2}$. As described above, output register 108 is configured to receive shifted (serialized) data $SH_1$ from upper shift register 104 when upper shift register 104 is performing shift function 116 and is configured to receive shifted (serialized) data $SH_2$ from lower shift register 106 when lower shift register 106 is performing shift function 120. As such, in FIG. 1, output register 108 can be configured to alternately receive parallel input data $P_{i1}$ from upper shift register 104 as shifted (serialized) data $SH_1$ and parallel input data $P_{i2}$ from lower shift register 106 as shifted (serialized) data $SH_2$ without additional control circuitry by utilizing one of function select clocks $CLK_{FS1}$ and $CLKF_{S2}$.

Thus, as described above, a serializer in accordance embodiments of the present invention can include a control circuit that is small and is not complex. For example, serializer 100 can include control circuit 202, which does not require a phase shifter to generate a signal for controlling selection of channels in serializer 100. Furthermore, control circuit 202 can easily be scaled when the number of channels in parallel input bus 110 is varied. For example, frequency $F_L$ of load clock $CLK_L$ and frequency $f_{SH}$ of shift clock $CLK_{SH}$ can easily be varied to accommodate more channels in parallel input bus 110. Also, frequency $F_L$ of load clock $CLK_L$ and frequency $f_{SH}$ of shift clock $CLK_{SH}$ can easily be varied to accommodate for throughput requirements of upper and lower shift registers 104 and 106 and output register 108. It will be appreciated that control circuit 202 is not limited to the specific design shown.

Figure 3:
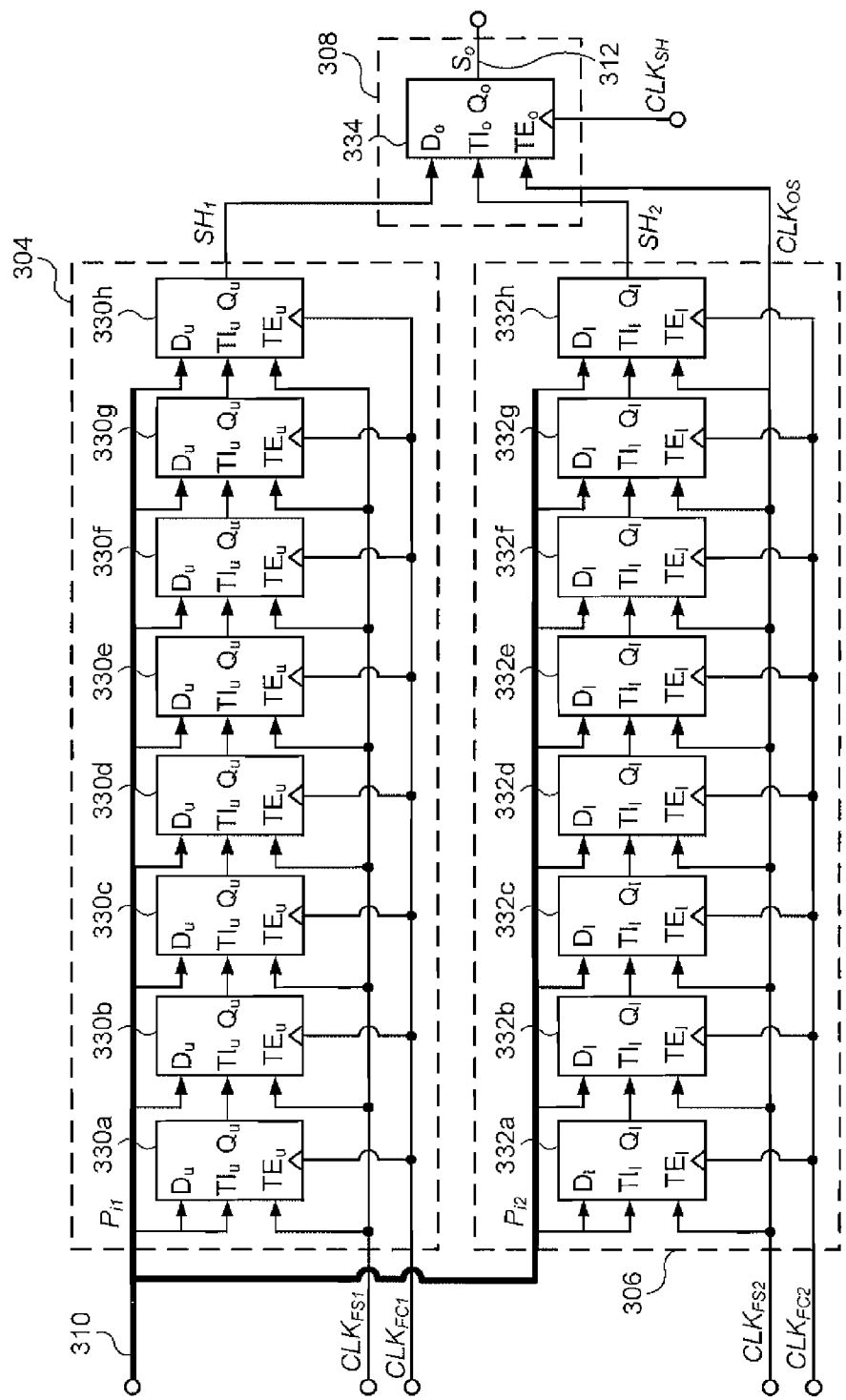
FIG. 3 illustrates exemplary upper and lower shift registers and an output register of a serializer, according to one embodiment of the invention.

Turning to FIG. 3, FIG. 3 shows upper and lower shift registers 304 and 306 and output register 308, according to one embodiment of the invention. Upper and lower shift registers 304 and 306 and output register 308 correspond respectively to upper and lower shift registers 104 and 106 and output register 108 in FIG. 1. Thus, in FIG. 3, parallel input bus 310, parallel input data $P_{i1}$ and $P_{i2}$, shifted (serialized) data $SH_1$ and $SH_2$, and serial output data $S_o$, and serial output 312 correspond respectively to parallel input bus 310, parallel input data $P_{i1}$ and $P_{i2}$, shifted (serialized) data $SH_1$ and $SH_2$, and serial output data $S_o$ in FIG. 1. Furthermore, control circuit 202 in FIG. 2 can provide function select clocks $CLK_{FS1}$ and $CLK_{FS2}$, function control clocks $CLK_{FC1}$ and $CLK_{FC2}$, and output select clock $CLK_{OS}$ as shown in FIG. 3.

As shown in FIG. 3, upper shift register 304 comprises scan flip-flops 330a, 330b, 330c, 330d, 330e, 330f, 330g, and 330h (also referred to herein as "scan flip-flops 330"). Each of scan flip-flops 330 have data inputs $D_u$ and data inputs $Ti_u$ and are configured to store one bit of parallel input data $P_{i1}$. As shown in FIG. 3, data inputs $D_u$ are configured to load parallel input data $P_{i1}$ from parallel input bus 310. For example, data inputs $D_u$ are connected to a corresponding channel of parallel input bus 310 and scan flip-flops 330 can each store one bit from a corresponding data input $D_u$. Also shown in FIG. 3, data inputs $TI_u$ are configured to shift parallel input data $P_{i1}$ through upper shift register 304. For example, FIG. 3 shows data inputs $TI_u$ connected in cascade.

Similarly, lower shift register 306 comprises scan flip-flops 332a, 332b, 332c, 332d, 332e, 332f, 332g, and 332h (also referred to herein as "scan flip-flops 332"). Each of scan flip-flops 332 have data inputs $D_l$ and data inputs $Ti_l$ and are configured to store one bit of parallel input data $P_{i2}$. As shown in FIG. 3, data inputs $D_l$ are configured to load parallel input data $P_{i2}$ from parallel input bus 310. For example, data inputs $D_l$ are connected to a corresponding channel of parallel input bus 310 and scan flip-flops 332 can each store one bit from a corresponding data input $D_l$. Also shown in FIG. 3, data inputs $TI_l$ are configured shift parallel input data $P_{i2}$ through upper shift register 304. For example, FIG. 3 shows data inputs $TI_l$ connected in cascade.

FIG. 3 also shows function select clock $CLK_{FS1}$ connected to data input selector $TE_u$ of each scan flip-flop 330. Furthermore, function control clock $CLK_{FC1}$ is connected to a clock input of each scan flip-flop 330. Similarly, function select clock $CLK_{FS2}$ is connected to data input selector $TE_l$ of each scan flip-flop 332. Furthermore, function control clock $CLK_{FC2}$ is connected to a clock input of each scan flip-flop 330. Thus, control circuit 202 can manage upper and lower shift registers 304 and 306 to convert parallel input data $P_{i1}$ and parallel input data $P_{i2}$ into serial output data $S_o$, as described above.

In FIG. 3, output register 308 comprises scan flip-flop 334 having data inputs $D_o$ and $TI_o$ and data input selector $TE_o$, which can store one bit at a time selected from shifted (serialized) data $SH_1$ and shifted (serialized) data $SH_2$. Data inputs $D_o$ and $TI_o$ are connected to respective outputs of upper and lower shift registers 304 and 306. Thus, data input selector $TE_o$ can receive output select clock $CLK_{OS}$ from control circuit 202 to select between receiving parallel input data $P_{i1}$ from upper shift register 304 as shifted (serialized) data $SH_1$ and parallel input data $P_{i2}$ from lower shift register 306 as shifted (serialized) data $SH_2$. As such, output register 308 is configured to alternately receive parallel input data $P_{i1}$ from upper shift register 304 as shifted (serialized) data $SH_1$ and parallel input data $P_{i2}$ from lower shift register 306 as shifted (serialized) data $SH_2$.

Thus, as described above, serializer 100 can comprise upper and lower shift registers 304 and 306 and output register 308 implemented using all scan flip-flops. Thus, serializer 100 does not require synchronization or re-time flip-flops and multiplexers or other combinational logic in the data conversion path, thereby allowing for fast conversion speed and smaller size. For example, serializer 100 can convert parallel input data $P_{i1}$ and $P_{i2}$ to serial output data $S_o$ while only being limited by the performance of scan flip-flops 330, 332, and 334. Furthermore, in one embodiment, scan flip-flops 330, 332, and 334 comprise only 1V CMOS standard cells. Thus, serializer 100 can be smaller, consume less power, and be implemented without custom design that would increase design cost. Serializer 100 also does not require current mode logic (CML) for the conversion. As such, serializer 100 does not require circuitry that may be required to convert from a CMOS signal to a CML signal and does not require a constant bias current. In one embodiment, serializer 100 has an area of 167 um$^2$ and consumes 0.94 mW per channel. Thus, the present invention allows for serializer 100 to be single stage and scalable while being efficient in power and area. In some embodiments, serializer 100 can operate at 8 GHz at the slow slow (SS) corner of a semiconductor wafer.

Figure 4:
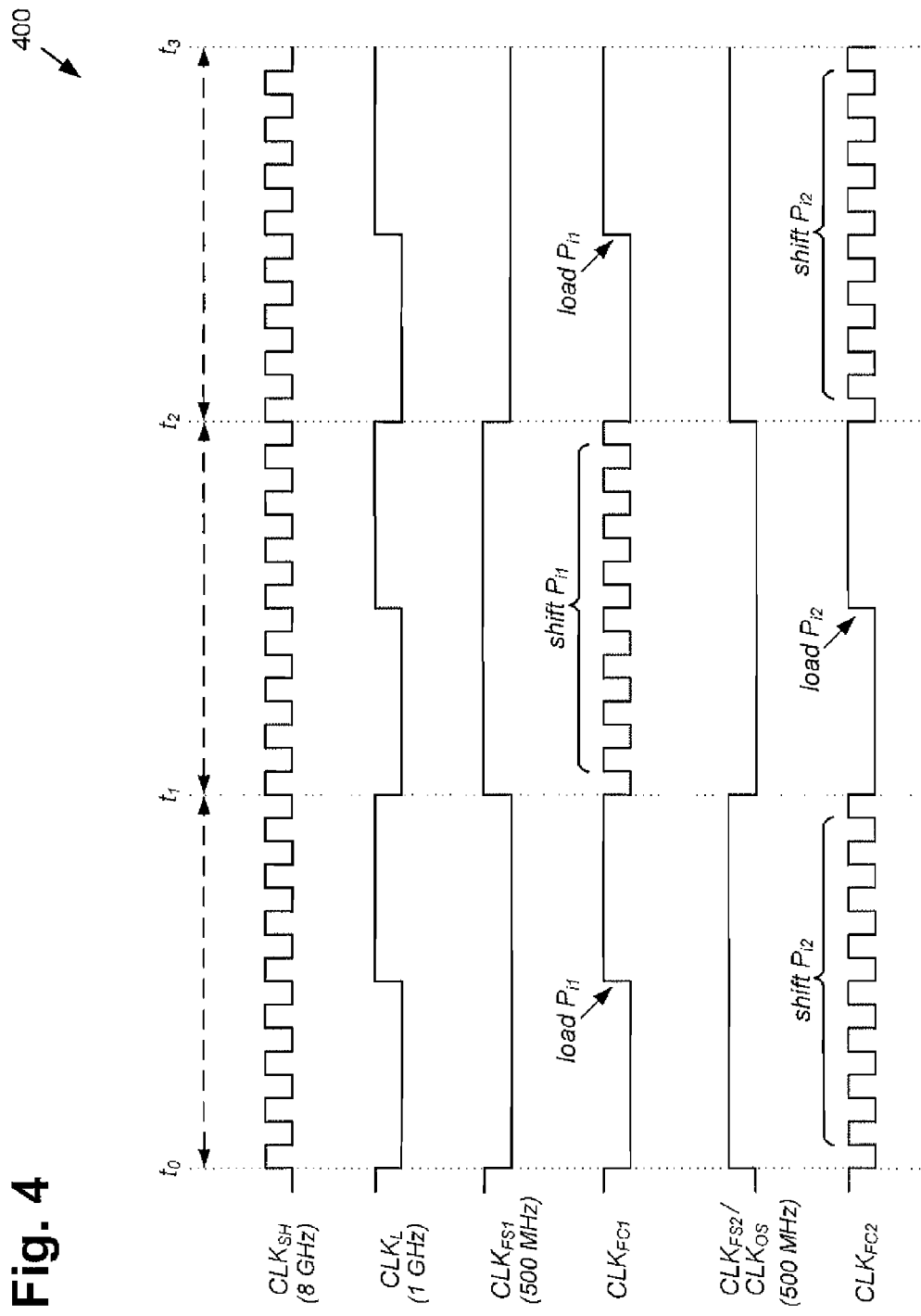
FIG. 4 illustrates exemplary waveforms of a serializer, according to one embodiment of the invention.

Referring to FIG. 4, FIG. 4 illustrates exemplary waveforms 400, according to one embodiment of the invention. FIG. 4 shows waveforms of shift clock $CLK_{SH}$, load clock $CLK_L$, function select clocks $CLK_{FS1}$ and $CLK_{FS2}$ and function control clocks $CLK_{FC1}$ and $CLK_{FC2}$ corresponding respectively to shift clock $CLK_{SH}$, load clock $CLK_L$, function select clocks $CLK_{FS1}$ and $CLK_{FS2}$ and function control clocks $CLK_{FC1}$ and $CLK_{FC2}$ in FIGS. 1 through 3. Also in the present embodiment, output selector $CLK_{OS}$ corresponds to output selector $CLK_{OS}$ in FIGS. 1 through 3 and is equal to function select clock $CLK_{FS2}$ in the present embodiment.

Exemplary operation of serializer 100 in FIG. 1 will be described with respect to waveforms 400 in FIG. 4, control circuit 202 in FIG. 2, and upper and lower shift registers 304 and 306 and output register 308 in FIG. 3. In the present example, shift clock $CLK_{SH}$ has a frequency of 8 GHz and load clock $CLK_L$ has a frequency of 1 GHz. Thus, function select clock $CLK_{FS2}$ has a frequency of 500 MHz due to frequency divider 228. Furthermore, function select clock $CLK_{FS1}$ is the inverse of function select clock $CLK_{FS2}$ due to inverter 226. Also, output selector $CLK_{OS}$ is equal to function select clock $CLK_{FS2}$ as shown in FIG. 4.

For the purposes of the present example, each of scan flip-flops 330, 332, and 334 are positive edge triggered flip-flops. However, in other embodiments, scan flip-flops 330, 332, and 334 can be negative edge triggered. Between times $t_0$ and $t_1$, function select clock $CLK_{FS1}$ is low. Thus, data input selectors $TE_u$ of scan flip-flops 330 are selecting for data inputs $D_u$. Also between times $t_0$ and $t_1$, data input selectors $TE_1$ of scan flip-flops 332 are selecting for data inputs $TI_1$. Thus, between times $t_0$ and $t_1$, when function control clock $CLK_{FC1}$ transitions high, each of scan flips-flops 330 will load one bit of parallel input data $P_{i1}$ through a corresponding data input $D_u$ in load function 114. Also between times $t_0$ and $t_1$, each time function control clock $CLK_{FC2}$ transitions high, one bit of parallel input data $P_{i2}$ will be shifted through scan flip-flops 332. Thus, between times $t_0$ and $t_1$ scan flip-flops 332 will shift one bit per positive edge of function control clock $CLK_{FC2}$ thereby shifting parallel input data $P_{i2}$ to output register 308 in shift function 120.

Also between times $t_0$ and $t_1$, output selector clock $CLK_{OS}$ is high. Thus, data input selector $TE_o$ of scan flip-flop 334 is selecting for data input $TI_o$. As such, output register 308 will receive parallel input data $P_{i2}$ from lower shift register 306 as shifted (serialized) data $SH_2$. As a clock of scan flip-flop 334 is connected to shift clock $CLK_{SH}$, between times $t_0$ and $t_1$, each time shift clock $CLK_{SH}$ transitions high, one bit of parallel input data $P_{i2}$ will be shifted through output register 308 to serial output data $S_o$. Thus, between times $t_0$ and $t_1$, output register 308 will receive parallel input data $P_{i2}$ from lower shift register 306.

Between times $t_1$ and $t_2$, function select clock $CLK_{FS2}$ is low. Thus, data input selectors $TE_1$ of scan flip-flops 332 are selecting for data inputs $D_1$. Also between times $t_1$ and $t_2$, data input selectors $TE_u$ of scan flip-flops 330 are selecting for data inputs $TI_u$. Thus, between times $t_1$ and $t_2$, when function control clock $CLK_{FC2}$ transitions high, each of scan flips-flops 332 will load one bit of parallel input data $P_{i2}$ through a corresponding data input $D_1$ in load function 118. Also between times $t_1$ and $t_2$, each time function control clock $CLK_{FC1}$ transitions high, one bit of parallel input data $P_{i1}$ will be shifted through scan flip-flops 330. Thus, between times $t_1$ and $t_2$ scan flip-flops 330 will shift one bit per positive edge of function control clock $CLK_{FC1}$ thereby shifting parallel input data $P_{i1}$ in shift function 116.

Also between times $t_1$ and $t_2$, output selector clock $CLK_{OS}$ is low. Thus, data input selector $TE_o$ of scan flip-flop 334 is selecting for data input $D_o$. As such, output register 308 will receive parallel input data $P_{i1}$ from upper shift register 304. As the clock of scan flip-flop 334 is connected to shift clock $CLK_{SH}$, between times $t_1$ and $t_2$, each time shift clock $CLK_{SH}$ transitions high, one bit of parallel input data $P_{i1}$ will be shifted through output register 308 into serial output data $S_o$. Thus, between times $t_1$ and $t_2$, output register 308 will receive parallel input data $P_{i1}$ from upper shift register 304. The sequence described above between times $t_0$ and $t_2$ can be repeated as desired.

Thus, as discussed above, in the embodiments of FIGS. 1 through 4, the present invention can provide for a serializer configured to convert parallel input data from a parallel input bus into serial output data on a serial output. As described above, in accordance with various embodiments, the serializer can advantageously avoid various features, which would otherwise result in a slow conversion speed, high power consumption, and large size. Furthermore, the serializer is scalable and does not require substantial redesign when the number of channels of a parallel input bus is varied. Thus, the present invention can provide for a single stage and scalable serializer that is efficient in power and area.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A serializer comprising:
  upper and lower shift registers configured to perform a load function wherein parallel input data is loaded from a parallel input bus and a shift function wherein said parallel input data is shifted to an output register;
  said upper shift register configured to perform said load function while said lower shift register performs said shift function and said lower shift register configured to perform said load function while said upper shift register performs said shift function;
  an output register configured to alternately receive all of said parallel input data from said upper shift register followed by all of said parallel input data from said lower shift register.

2. The serializer of claim 1, wherein said output register is configured to alternate between receiving said parallel input data from said upper shift register and said parallel input data from said lower shift register.

3. The serializer of claim 1, wherein said upper and lower shift registers are configured to perform said shift function at a frequency of a shift clock and wherein said load function of said upper and lower shift registers is performed at a frequency of a load clock.

4. The serializer of claim 3, wherein said parallel input bus has a number of channels, said frequency of said load clock being equal to said frequency of said shift clock divided by said number of channels.

5. The serializer of claim 1, wherein said upper and lower shift registers are configured to perform said shift function at a frequency of a shift clock, said output register configured to alternately receive said parallel input data from said upper shift register and said parallel input data from said lower shift register at said frequency of said shift clock.

6. The serializer of claim 1, wherein said upper and lower shift registers are configured to perform said load function and said shift function by selectively receiving a load clock and a shift clock.

7. The serializer of claim 1, wherein said upper and lower shift registers are configured to select between performing said load function and said shift function responsive to a respective function select clock.

8. The serializer of claim 7, wherein said respective function select clock of said upper shift register is an in inverse of said respective function select clock of said lower shift register.

9. The serializer of claim 7, wherein said output register is configured to select between receiving said parallel input data from said upper shift register and said parallel input data from said lower shift register responsive to one of said respective function select clocks.

10. The serializer of claim 1, wherein said upper and lower shift register comprise scan flip-flops, said scan flip-flops having first and second data inputs, said first data inputs are configured to load said parallel input data from said parallel input bus and said second data inputs are connected in cascade.

11. The serializer of claim 1, wherein said output register is a flip-flop.

12. The serializer of claim 1, wherein said output register is a scan flip-flop having a first data input configured to receive said parallel input data from said upper shift register and a second data input configured to receive said parallel input data from said lower shift register.

13. A serializer comprising:
an upper shift register comprising scan flip-flops, each of said scan flip-flops having first and second data inputs, said first data inputs configured to load first parallel input data from a parallel input bus and said second data inputs configured to shift said first parallel input data through said upper shift register;
a lower shift register comprising scan flip-flops, each of said scan flip-flops having first and second data inputs, said first data inputs configured to load second parallel input data from said parallel input bus and said second data inputs configured to shift said second parallel input data through said lower shift register;
an output register configured to alternately receive said first parallel input data from said upper shift register and said second parallel input data from said lower shift register.

14. The serializer of claim 13, wherein said output register is configured to alternate between receiving said first parallel input data and said second parallel input data.

15. The serializer of claim 13, wherein said second data inputs of said upper shift register are connected in cascade and said second data inputs of said lower shift register are connected in cascade.

16. The serializer of claim 13, wherein said output register is a flip-flop.

17. The serializer of claim 13, wherein said output register is a scan flip-flop having a first data input configured to receive said first parallel input data from said upper shift register and a second data input configured to receive said second parallel input data from said lower shift register.

18. The serializer of claim 13, wherein said upper shift register is configured to select between loading said first parallel input data from said parallel input bus and shifting said first parallel input data responsive to a function select clock.

19. The serializer of claim 13, wherein said upper shift register is configured to shift said first parallel input data at a frequency of a shift clock, said output register configured to alternately receive said first parallel input data from said upper shift register and said parallel input data from said lower shift register at said frequency of said shift clock.

20. The serializer of claim 13, wherein said scan flip-flops comprise complementary metal oxide semiconductor (CMOS) standard cells.

* * * * *